(12) United States Patent
Abatchev et al.

(10) Patent No.: US 9,267,605 B2
(45) Date of Patent: Feb. 23, 2016

(54) PRESSURE CONTROL VALVE ASSEMBLY OF PLASMA PROCESSING CHAMBER AND RAPID ALTERNATING PROCESS

(75) Inventors: Mirzafer Abatchev, Fremont, CA (US); Camelia Rusu, Pleasanton, CA (US); Brian McMillin, Pleasanton, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 975 days.

(21) Appl. No.: 13/290,657

(22) Filed: Nov. 7, 2011

(65) Prior Publication Data
US 2013/0115776 A1 May 9, 2013

(51) Int. Cl.
| | |
|---|---|
| *C23C 16/00* | (2006.01) |
| *F16K 3/02* | (2006.01) |
| *H01L 21/3065* | (2006.01) |
| *H01J 37/32* | (2006.01) |

(52) U.S. Cl.
CPC .......... *F16K 3/0209* (2013.01); *H01J 37/32816* (2013.01); *H01J 37/32834* (2013.01); *H01L 21/30655* (2013.01); *Y10T 137/7837* (2015.04)

(58) Field of Classification Search
CPC ............. H01L 21/30655; F16K 3/0209; H01J 37/32816; H01J 37/32834; H01J 37/32449; C23C 16/4412; Y01T 137/7837; Y10T 137/86936; Y10T 137/7762
USPC .................. 438/701, 710, 758; 137/511, 629; 118/715, 723 I; 156/345.29, 345.48
See application file for complete search history.

(56) References Cited

U.S. PATENT DOCUMENTS

| | | | |
|---|---|---|---|
| 4,489,756 A * | 12/1984 | Balz | 137/625.33 |
| 5,070,813 A | 12/1991 | Sakai et al. | |
| 5,501,893 A | 3/1996 | Laermer et al. | |
| 5,577,707 A | 11/1996 | Brida | |
| 5,765,592 A | 6/1998 | Karlicek | |
| 5,873,562 A | 2/1999 | Marugg | |
| 6,022,483 A | 2/2000 | Aral | |
| 6,030,902 A | 2/2000 | Donohoe | |
| 6,080,679 A | 6/2000 | Suzuki | |
| 6,089,537 A | 7/2000 | Olmsted | |
| 6,090,206 A | 7/2000 | Bang et al. | |
| 6,142,163 A | 11/2000 | McMillin et al. | |

(Continued)

OTHER PUBLICATIONS

International Preliminary Report on Patentability issued May 13, 2014 for PCT/US2012/061035.

(Continued)

*Primary Examiner* — Khiem D Nguyen
(74) *Attorney, Agent, or Firm* — Buchanan, Ingersoll & Rooney PC

(57) ABSTRACT

A pressure control valve assembly of a plasma processing chamber in which semiconductor substrates are processed includes a housing having an inlet, an outlet and a conduit extending between the inlet and the outlet, the inlet adapted to be connected to an interior of the plasma processing chamber and the outlet adapted to be connected to a vacuum pump which maintains the plasma processing chamber at desired pressure set points during rapid alternating phases of processing a semiconductor substrate in the chamber. A fixed slotted valve plate having a first set of parallel slots therein is fixed in the conduit such that gasses withdrawn from the chamber into the conduit pass through the first set of parallel slots. A movable slotted valve plate having a second set of parallel slots therein is movable with respect to the fixed slotted valve plate so as to adjust pressure in the chamber.

18 Claims, 3 Drawing Sheets

(56) References Cited

U.S. PATENT DOCUMENTS

| | | | |
|---|---|---|---|
| 6,161,576 A | 12/2000 | Maher et al. | |
| 6,261,408 B1 | 7/2001 | Schneider et al. | |
| 6,293,306 B1 | 9/2001 | Brenes | |
| 6,302,372 B1 | 10/2001 | Sauer et al. | |
| 6,391,788 B1 | 5/2002 | Khan et al. | |
| 6,409,149 B1 | 6/2002 | Maher, Jr. | |
| 6,497,734 B1 | 12/2002 | Barber et al. | |
| 6,527,911 B1 | 3/2003 | Yen et al. | |
| 6,598,615 B1 | 7/2003 | Holland et al. | |
| 6,682,603 B2 | 1/2004 | Gondhalekar et al. | |
| 6,722,642 B1 | 4/2004 | Sutton et al. | |
| 6,843,264 B2 | 1/2005 | Chang et al. | |
| 6,911,157 B2 | 6/2005 | Edamura et al. | |
| 6,932,111 B2 | 8/2005 | Ishigaki | |
| 7,140,847 B2 | 11/2006 | Boger et al. | |
| 7,270,311 B1 | 9/2007 | Brenes | |
| 7,278,444 B2 | 10/2007 | Lucas et al. | |
| 7,311,491 B2 | 12/2007 | Desbiolles | |
| 7,381,650 B2 | 6/2008 | Johnson et al. | |
| 7,405,162 B2 | 7/2008 | Maruyama et al. | |
| 7,428,915 B2 | 9/2008 | Nguyen et al. | |
| 7,481,902 B2 | 1/2009 | Shinriki et al. | |
| 7,681,590 B2 | 3/2010 | Lo | |
| 7,723,238 B2 | 5/2010 | Chiba | |
| 7,731,151 B2 | 6/2010 | Lee | |
| 7,814,922 B2 | 10/2010 | Tollner | |
| 7,828,928 B2 | 11/2010 | Makino et al. | |
| 8,043,430 B2 | 10/2011 | Dhindsa et al. | |
| 8,070,459 B2 | 12/2011 | Tollner | |
| 2002/0038791 A1* | 4/2002 | Okumura et al. | 216/71 |
| 2002/0134441 A1 | 9/2002 | Kusumoto et al. | |
| 2002/0168467 A1 | 11/2002 | Puech | |
| 2005/0016956 A1 | 1/2005 | Liu et al. | |
| 2006/0121211 A1* | 6/2006 | Choi | 427/569 |
| 2007/0221130 A1 | 9/2007 | Nozawa et al. | |
| 2007/0281107 A1 | 12/2007 | Kitagawa | |
| 2009/0008369 A1* | 1/2009 | Nozawa et al. | 219/121.54 |
| 2009/0206055 A1 | 8/2009 | Sato et al. | |
| 2009/0242512 A1 | 10/2009 | Beaudry | |
| 2009/0325386 A1* | 12/2009 | Devine et al. | 438/706 |
| 2010/0156054 A1 | 6/2010 | Sun et al. | |
| 2010/0204810 A1* | 8/2010 | Saito | 700/90 |
| 2010/0252121 A1 | 10/2010 | Saito et al. | |
| 2010/0294431 A1* | 11/2010 | Maquin | 156/345.26 |
| 2011/0244686 A1 | 10/2011 | Aso et al. | |
| 2012/0012252 A1* | 1/2012 | Kusumoto et al. | 156/345.24 |

OTHER PUBLICATIONS

International Search Report and Written Opinion mailed Jan. 9, 2013 for PCT/US2012/061035.

* cited by examiner

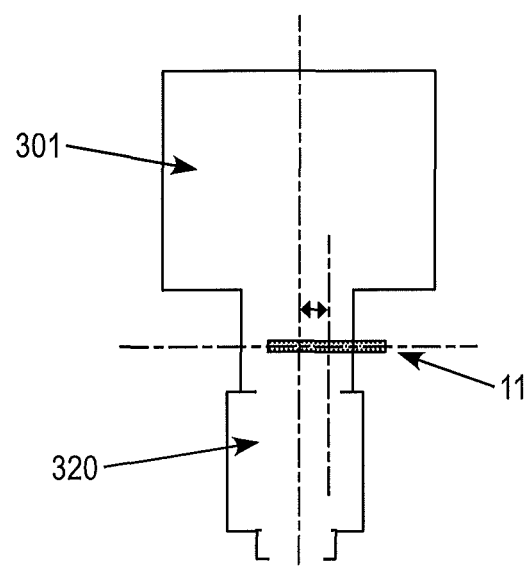
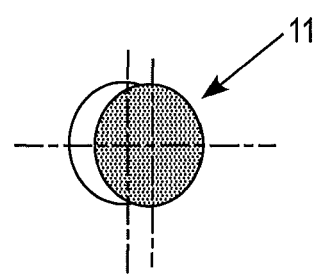
FIG. 2A
FIG. 2B

PRESSURE CONTROL VALVE ASSEMBLY OF PLASMA PROCESSING CHAMBER AND RAPID ALTERNATING PROCESS

FIELD OF THE INVENTION

The invention relates to a pressure control valve assembly located between a vacuum pump and a plasma processing chamber in which semiconductor substrates are processed. The pressure control valve assembly can be used to effect rapid pressure changes in the plasma chamber during processing of a semiconductor substrate undergoing multi-step processing wherein changes in chamber pressure are desired.

BACKGROUND

The Bosch process is a plasma etch process that has been widely used to fabricate deep vertical (high aspect ratio) features (with depth such as tens to hundreds of micrometers), such as trenches and vias, in the semiconductor industry. The Bosch process comprises cycles of alternating etching steps and deposition steps. Details of the Bosch process can be found in U.S. Pat. No. 5,501,893, which is hereby incorporated by reference. The Bosch process can be carried out in a plasma processing apparatus configured with a high-density plasma source, such as an inductively coupled plasma (ICP) source, in conjunction with a radio frequency (RF) biased substrate electrode. Process gases used in the Bosch process for etching silicon can be sulfur hexafluoride ($SF_6$) in an etching step and octofluorocyclobutane ($C_4F_8$) in a deposition step. The process gas used in the etching step and the process gas used in the deposition step are respectively referred to as "etch gas" and "deposition gas" hereinbelow. During an etching step, $SF_6$ facilitates spontaneous and isotropic etching of silicon (Si); during a deposition step, $C_4F_8$ facilitates the deposition of a protective polymer layer onto sidewalls as well as bottoms of the etched structures. The Bosch process cyclically alternates between etch and deposition steps enabling deep structures to be defined into a masked silicon substrate. Upon energetic and directional ion bombardment, which is present in the etching steps, any polymer film coated in the bottoms of etched structures from the previous deposition step will be removed to expose the silicon surface for further etching. The polymer film on the sidewall will remain because it is not subjected to direct ion bombardment, thereby, inhibiting lateral etching.

U.S. Patent Publication No. 2009/0242512 discloses an example of a multi-step Bosch type process in which the chamber pressure is at 35 mTorr for 5 seconds during deposition of a passivation film, 20 mTorr for 1.5 seconds during a low pressure etch step and 325 mTorr for 7.5 seconds during a high pressure etch step (see Table 4.2.1) or 35 mTorr for 5 seconds during deposition, 20 mTorr for 1.5 seconds during low pressure etch, 325 mTorr for 7.5 seconds during high pressure etch and 15 mTorr for 1 second during low pressure etch (see Table 4.2.2).

Variation in chamber pressure is desired in other processes such as atomic layer deposition, plasma enhanced CVD, multi-step processes of plasma etching openings in mask material and removal of the mask material, multi-step plasma etch processes wherein the concentration of etchant gas is periodically varied or different layers of material are sequentially etched. To reduce the overall processing time, reduction in the transition period between high and low pressure phases of such cyclical processes would be desirable. For instance, U.S. Patent Publication No. 2009/0325386 discloses a conductance limiting element for rapid adjustment of pressure in a low volume vacuum chamber on the order of tens of milliseconds. The '386 publication states that during processing, a single chemical species can be flowed in the processing region during multiple pressure cycles or different chemical species can be introduced during multiple pressure cycles with the time at high or low pressure ranging from 0.1 to 2 seconds.

SUMMARY

According to one embodiment, a pressure control valve assembly of a plasma processing chamber in which semiconductor substrates are processed comprises a housing, a fixed slotted valve plate, a movable slotted valve plate and a drive mechanism which moves the movable slotted plate between first and second positions. The housing includes an inlet, an outlet and a conduit extending between the inlet and the outlet wherein the inlet is adapted to be connected to an interior of the plasma processing chamber and the outlet is adapted to be connected to a vacuum pump which maintains the plasma processing chamber at desired pressure set points during processing the substrate. A preferred plasma process is rapid alternating phases of deposition of protective polymer and etching of high aspect ratio features into a semiconductor substrate undergoing processing in the chamber.

The fixed slotted valve plate includes a first set of parallel slots therein and the fixed slotted valve plate is immovably fixed in the conduit such that gasses withdrawn from the chamber travel into the conduit and pass through the first set of parallel slots. The movable slotted valve plate includes a second set of parallel slots therein and the movable slotted valve plate is moved by the drive mechanism between the first and second positions to effect a change in chamber pressure. For example, in the first position the movable slotted valve plate can completely block or partially block the first set of parallel slots to decrease gas flow conductance and raise chamber pressure. In the second position, the movable slotted valve plate can align the first set of slots with the second set of slots to increase gas flow conductance and lower the chamber pressure. The drive mechanism is operable to rapidly move the movable slotted valve plate between the first and second positions. A preferred direction of movement of the movable slotted valve plate is linear movement.

In a method of processing a semiconductor substrate in a chamber having the pressure control valve assembly attached to an outlet of the chamber, the method includes adjusting chamber pressure from a lower pressure to a higher pressure by positioning the movable slotted valve plate in the first position while supplying a processing gas to the chamber and adjusting chamber pressure from a higher pressure to a lower pressure by positioning the movable slotted valve plate in the second position while supplying the same or different process gas to the chamber. The chamber is preferably an inductively coupled plasma (ICP) chamber in which RF energy is transmitted into the chamber through a dielectric window. ICP chambers used for single wafer processing of 300 mm diameter wafers can have chamber volumes up to 100 liters and pressure settings in the chamber can vary from 20 mTorr to 300 mTorr. The pressure control valve assembly described herein can be fitted between a vacuum pump and the outlet of an ICP chamber having a chamber volume of over 60 liters and rapid cycling of pressure changes in the chamber can be effected by reciprocated linear movement of the movable slotted valve plate.

In one embodiment, the processing can comprise plasma etching openings in silicon using alternating steps of etching and deposition wherein a first processing gas comprises a fluorine containing gas supplied for less than 1.3 seconds and energized into a plasma state while maintaining chamber pressure above 150 mTorr and a second processing gas comprises a fluorocarbon containing gas supplied for less than 0.7 second and energized into a plasma state while maintaining the chamber pressure below 130 mTorr. The method can further include a polymer clearing step before the etching step wherein the polymer clearing step is carried out by supplying a polymer clearing gas for at least 200 milliseconds and energizing the polymer clearing gas into a plasma state while maintaining the chamber pressure below 150 mTorr.

A further process comprises a deposition process wherein chamber pressure is repeatedly varied while supplying the same or different process gas while the chamber pressure is cycled between various set points. For example, at the different chamber pressures different process gases can be supplied or the same processing gas can be supplied at different flow rates.

BRIEF DESCRIPTION OF THE DRAWINGS

FIG. 2A shows a prior art pressure control valve system.

FIG. 2B shows a top view of a throttle valve of the system shown in FIG. 2A.

DETAILED DESCRIPTION

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention. As used herein, the term "about" should be construed to include values up to 10% above or below the values recited.

Described herein is a pressure control valve assembly of a plasma processing chamber in which rapid pressure changes are desired. For example, deep features of semiconductor substrates can be processed by rapid alternating phases of etching and passivation (deposition of a protective layer of material) at different chamber pressures. The pressure control valve assembly is designed to minimize the time in which pressure can be changed in the plasma processing chamber. One limitation of the Bosch process is roughened sidewalls of etched deep features. This limitation is due to the periodic etch/deposition scheme used in the Bosch process and is known in the art as sidewall "scalloping". For many device applications, it is desirable to minimize this sidewall roughness or scalloping. The extent of scalloping is typically measured as a scallop length and depth. The scallop length is the peak-to-peak distance of the sidewall roughness and is directly correlated to the etch depth achieved during a single etch cycle. The scallop depth is the peak to valley distance of sidewall roughness and is correlated to the degree of anisotropy of an individual etching step. The extent of scallop formation can be minimized by shortening the duration of each etch/deposition step (i.e. shorter etch/deposition steps repeated at a higher frequency).

In addition to smoother feature sidewalls it is also desirable to achieve a higher overall etch rate. The overall etch rate is defined as a total depth etched in a process divided by a total duration of the process. The overall etch rate can be increased by increasing efficiency within a process step (i.e. decreasing dead time).

Figure 1:
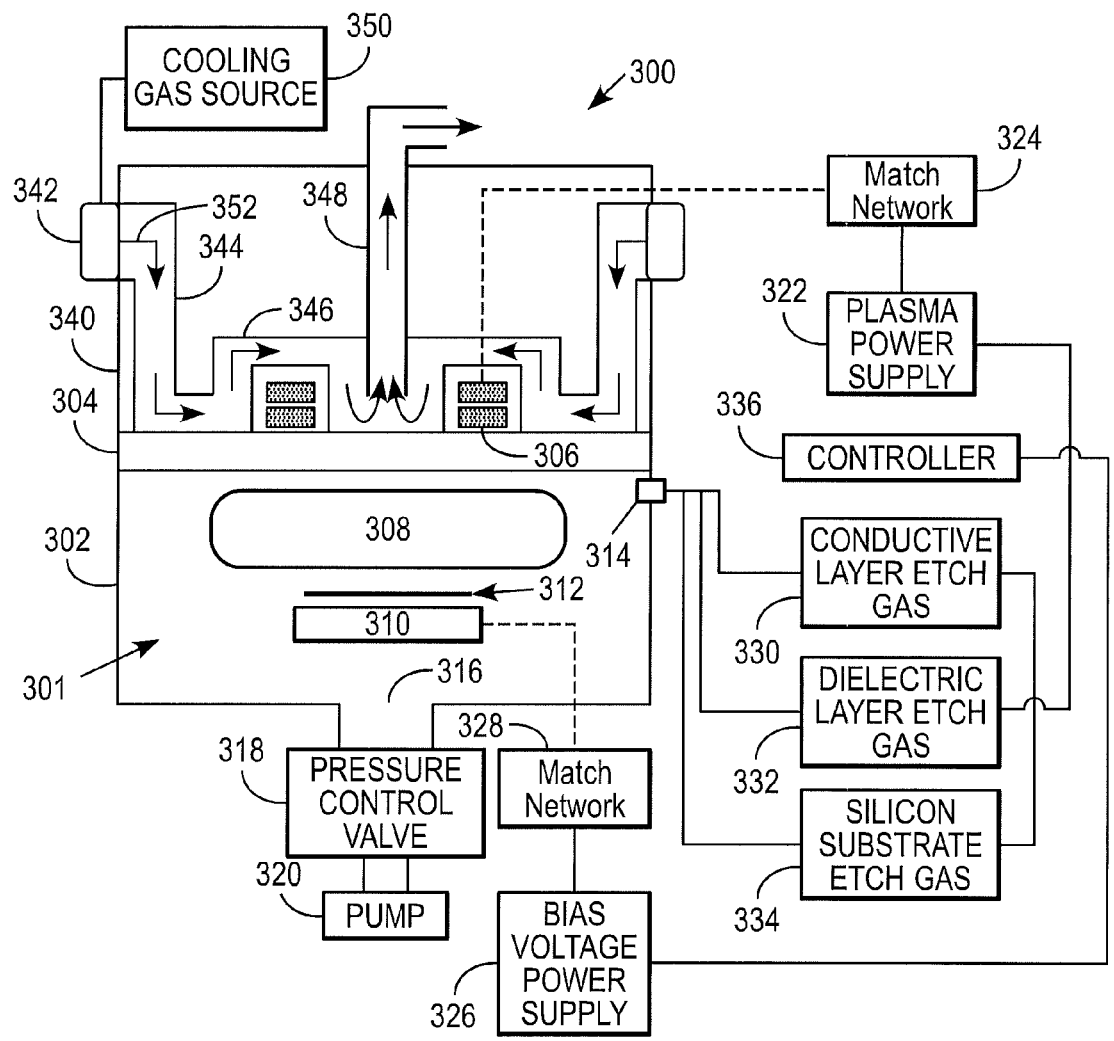
FIG. 1 shows a plasma processing system and pressure control valve which may be used to carry out rapid alternating processing of a semiconductor substrate.

FIG. 1 shows a schematic view of a plasma processing system 300 including a plasma reactor 302 having a plasma processing chamber 301 therein. A plasma power supply 322, tuned by a match network 324 supplies power to an antenna 306 located near a window 304 to create a plasma 308 in plasma processing chamber 301. Antenna 306 may be configured to produce a uniform diffusion profile within processing chamber 301; for example, antenna 306 may be configured for a toroidal power distribution in plasma 308. Window 304 is provided between the antenna 306 and the interior of the plasma chamber 301 and is made of a dielectric material which allows RF energy to pass from antenna 306 to plasma chamber 301. A wafer bias voltage power supply 326 tuned by a match network 328 provides power to an electrode 310 to set the bias voltage on wafer 312, which is supported by electrode 310, incorporated in a substrate support which supports the wafer. Set points for plasma power supply 322 and wafer bias voltage power supply 326 are set by controller 336. The chamber 301 includes a vacuum pumping apparatus 320, and pressure control valve assembly 318, which control the interior of pressure of chamber 301.

FIG. 2A illustrates a conventional pressure control valve assembly. The pressure control valve assembly includes a pendulum throttle valve 11 between the process chamber 301 and turbomolecular pump 320 of the plasma processing system 300. Pivotal movement of the throttle valve 11 is controlled by a stepper motor, (not shown) which at count 0 the valve is fully closed and at count 1000 is fully opened. As shown in FIG. 2B, the throttle valve 11 is swung across the conduit between the chamber 301 and the vacuum pump 320 to control gas flow conductance.

Many rapid alternating processes for high aspect ratio features in silicon require considerable changes of pressure between passivating and etching phases. Most rapid alternating processes require throttle valve movement between 50 and 250 counts in less than 300 milliseconds, and current vacuum systems are not capable of covering this required range. As an example, it may be desirable to move a throttle valve from a maximum of 255 counts to a minimum position of 90 counts in under 300 milliseconds. However, with a pendulum throttle valve it may only be possible to move the valve from a maximum of 235 counts to a minimum position of 90 counts in 340 milliseconds (425 counts/second).

Figure 3A:
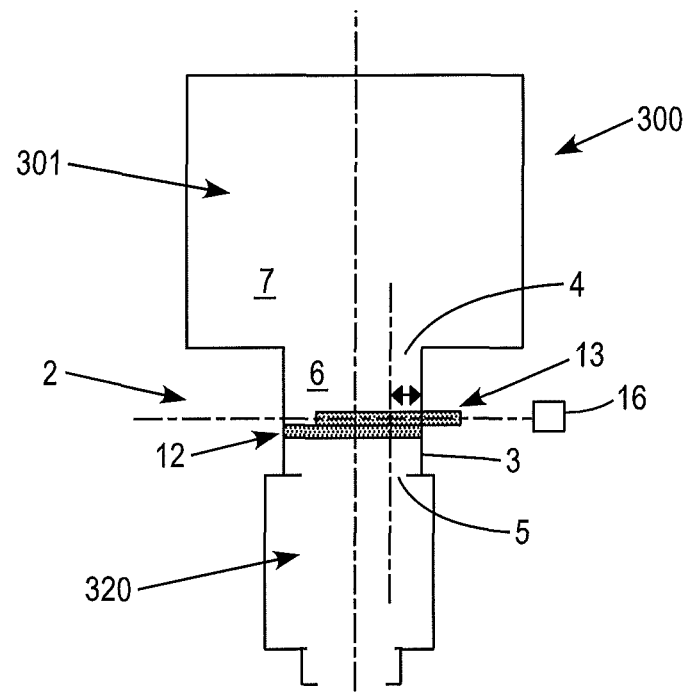
FIG. 3A shows a pressure control system incorporating a throttle valve assembly having a fixed slotted valve plate and a movable slotted valve plate.

FIG. 3A shows an embodiment of a pressure control system wherein a pressure control valve assembly 2 includes a housing 3 having an inlet 4, an outlet 5 and a conduit 6 extending between the inlet and the outlet, the inlet adapted to be connected to an interior of the plasma processing chamber 301 and the outlet adapted to be connected to a vacuum pump 320 which maintains the plasma processing chamber at desired pressure set points during processing of a semiconductor substrate in the chamber. The pressure control valve assembly includes a fixed slotted valve plate 12 having a first set of parallel slots 14 therein and fixed in the conduit such that gasses withdrawn from the chamber into the conduit pass through the first set of parallel slots and a movable slotted plate 13 having a second set of parallel slots 15 therein and movable to first and second positions with respect to the fixed slotted plate so as to block the first set of parallel slots 14 to a greater extent in the first position than in the second position. The fixed slotted valve plate 12 is preferably in the form of a slotted disk, and the movable slotted valve plate 13 is preferably in the form of a slotted disk which can be reciprocated in a linear direction in the conduit 6 between the process chamber 301 and turbomolecular pump 320 of the plasma processing apparatus 300. The movable slotted valve plate 13 is controlled by a drive mechanism 16 which includes a stepper motor (not shown). The fixed slotted valve plate 12 may be above or below the movable slotted valve plate 13.

Figure 3B:
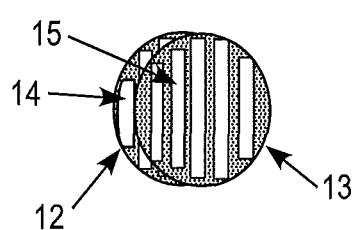
FIG. 3B shows the movable slotted valve plate in a laterally offset position at which parallel slots in the fixed slotted valve plate and movable slotted valve plate are aligned and in fluid communication.

FIG. 3B shows a top view of fixed slotted valve plate 12 and the movable slotted valve plate 13 positioned such that the slots 14, 15 are axially aligned. Slots 14 and 15 are preferably linear slots having the same widths and varying lengths and arranged such that when the stepper motor is at count 0 they are not aligned and at a non-zero position the slots 14 and 15 are aligned to provide greater flow conductance of gases from the chamber. Referring back to FIG. 3A, it is possible to rapidly change pressure in the chamber by moving the movable slotted valve plate 13 a short distance to vary pressure in the chamber. For instance, the movable slotted valve plate 13 can be in a first position at which the slots 14 and 15 are more blocked to achieve a higher chamber pressure than when the movable slotted valve plate 13 is in a second position at which the slots 14 and 15 are less blocked to achieve a lower chamber pressure due to greater flow conductance through the pressure valve assembly. Alignment of the slots allows the pressure of the process chamber 301 (and therefore conductance) to be rapidly changed to desired set points in fewer stepper motor counts than with the conventional pressure control assembly shown in FIG. 2B.

Figure 3C:
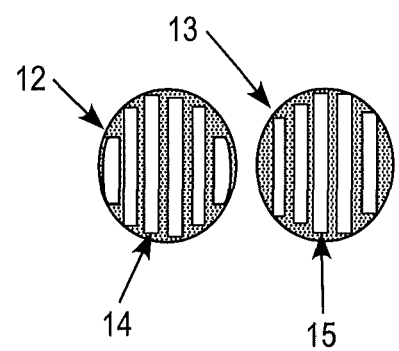
FIG. 3C shows an embodiment of the slotted valve plates wherein the movable valve plate has 5 parallel slots and the fixed valve plate has 6 parallel slots.

FIG. 3C shows the fixed slotted valve plate 12 in the form of a disk with 6 parallel slots 14 which are oblique to the circumference of the disk. Movable slotted valve plate 13 is a disk with the same diameter as disk 12 but with 5 parallel slots 15 which are oblique to the circumference of the disk. Slots 14 and 15 can be configured such that at stepper motor count 0 there is no overlap (the slots are blocked), and at a non-zero position slots 14 and 15 overlap to allow a rapid pressure change to lower pressure in the chamber. While valve plates with 5 or 6 slots are illustrated, the valve plates can have different slot arrangements such as 2 to 20 parallel slots and/or slots of different configurations.

The fixed slotted valve plate 12, and movable slotted valve plate 13, which have parallel slots 14 and 15 provide an improved pressure control system for controlling process chamber 301 pressures. The improved pressure control system can overcome problems, such as "scalloping" with conventional pressure control systems therein which have high step counts to change the pressure (conductance) of process chambers for plasma processing apparatus.

In a preferred arrangement fixed slotted valve plate 12 is immovably fixed in place below the movable slotted throttle plate 13 in a housing 3 located between the process chamber and turbomolecular pump. Alternatively the fixed slotted valve plate 12 may be located above the movable slotted valve plate 13. This configuration will allow the pressure and conductance of the process chamber to alternate at high speeds and conform with the rapid processing of the semiconductor substrate.

In use, a semiconductor substrate can be processed in a chamber having the pressure control valve assembly attached to an outlet of the chamber. The processing can include adjusting chamber pressure to a higher pressure by positioning the movable slotted valve plate in the first position at which the slots in the fixed slotted valve plate are blocked by the non-slotted portions of the movable slotted valve plate while supplying a first processing gas to the chamber. The chamber pressure can be adjusted to a lower pressure by positioning the movable slotted valve plate in a second position at which the slots in the fixed slotted valve plate are aligned with slots in the movable slotted valve plate to increase flow conductance of gases removed from the chamber. The chamber can be an inductively coupled plasma chamber having a chamber volume of over 60 liters.

The open area of the slots can be 25 to 50%, preferably 30 to 50%. The speed of changing the flow conductance can be increased by using valve plates with a larger number of slots. For example, the valve plates can each have 2 to 20 parallel slots of equal width. The space between the slots can be equal to or greater than the slot width. As an example, for a valve plate of radius R and 8 parallel slots of uniform width, the width of each slot can be about 0.1 R to provide an open area of about 35%.

The number and size of the slots can be arranged such that when the movable valve plate is in the first position, the slots partially overlap to provide an open area of 10 to 20% extending through both valve plates. When moved to the second position, the slots in the movable valve plate can overlap the slots in the fixed valve plate to a greater extent to provide an open area of 25 to 50%, preferably 30 to 40%. The stepper motor can rapidly move the movable slotted valve plate from the first position to the second position within 100 milliseconds (ms), e.g., within 70 ms.

In a comparison between a standard valve plate and a slotted valve plate assembly having 8 uniform width slots, the following Table shows the stepper motor counts, relative open area and time required to achieve movement of the valve plates using a standard 500 count per minute stepper motor.

|  | Relative Open Area | Stepper Motor Counts | Time |
| --- | --- | --- | --- |
| Standard Valve | 11% | 90 | 340 msec |
|  | 30% | 235 |  |
| Slotted Valve | 11% | 18 | 70 msec |
|  | 30% | 48 |  |

The plasma processing apparatus can be used to etch silicon on a semiconductor substrate supported on a substrate support at a rate of at least 10 μm/min and the plasma processing apparatus can alternately supply etch gas and deposition gas in a plasma confinement zone (chamber gap) in the processing chamber within about 500 milliseconds. In one embodiment, the etching gas is a fluorine containing gas such as $SF_6$ and the deposition gas is a fluorocarbon containing gas such as $C_4F_8$.

In operation, the gas supply system preferably does not divert the etching gas to a vacuum line during supply of the deposition gas to the chamber and does not divert the deposition gas to a vacuum line during supply of the etching gas to the chamber. Processing of a substrate using the plasma processing apparatus described above preferably comprises (a) supporting the substrate in the chamber, (b) supplying the etching gas to the chamber, (c) energizing the etching gas in the chamber into a first plasma and processing the substrate with the first plasma, (d) supplying the deposition gas to the chamber, (e) energizing the deposition gas in the chamber into a second plasma and processing the substrate with the second plasma, (f) repeating steps (b)-(e) with a total cycle time of no greater than 1.8 seconds. The etching gas preferably replaces at least 90% of the deposition gas within a period of about 500 milliseconds in step (b), and the deposition gas preferably replaces at least 90% of the etching gas within a period of about 500 milliseconds (d). During the process, pressure in the chamber is varied from a first pressure setting to a second pressure setting during steps (b)-(e). During a cycle of supplying the etching gas and deposition gas, a total time of supplying the etching gas can be 1.5 seconds or less and a total time of supplying the deposition gas can be 1 second or less. For example, using $SF_6$ as the etch gas and $C_4F_8$ as the deposition gas, pressure can be maintained above 150 mTorr in step (c) and below 140 mTorr in step (e).

Chamber pressure can be rapidly adjusted by maintaining the movable slotted valve plate in a first position at which higher chamber pressure is desired during step (c) and maintaining the movable slotted valve plate in a second position at which lower chamber pressure is desired during step (e). Thus, it is possible to maintain pressure in the chamber during supply of the etching gas greater than 70 mTorr (e.g., 80 mTorr) or greater than 150 mTorr (e.g., 180 mTorr) and pressure in the chamber during supply of the deposition gas less than 140 mTorr (e.g., 120 mTorr) or less than 60 mTorr (e.g., 50 mTorr). In a preferred process, the etching gas is supplied to the chamber at a flow rate of at least 500 sccm and the deposition gas is supplied to the chamber at a flow rate of less than 500 sccm. The alternate steps of supplying etching gas and deposition gas can be carried out for at least 100 cycles.

During the supply of the etching gas the substrate can be subjected to plasma etching of high aspect ratio openings with pressure in the chamber maintained at less than 150 mTorr for 200 milliseconds during a polymer clearing phase of the etching step and at over 150 mTorr for the remainder of the plasma etching step. During the supply of the deposition gas the second plasma can deposit a polymer coating on sidewalls of the openings with pressure in the chamber maintained at less than 150 mTorr for the entire deposition step. The etching gas can be one or more of $SF_6$, $CF_4$, $XeF_2$, $NF_3$, Cl containing gas such as $CCl_4$ and the deposition gas can be a fluorocarbon containing gas such as one or more of $C_4F_8$, $C_4F_6$, $CH_2F_2$, $C_3F_6$, $CH_3F$. The etching gas can be supplied through any suitable gas delivery system including fast acting valves wherein fast acting solenoid valves upon receiving a signal from a controller send pneumatic air to a fast switching valves within 10 milliseconds and total time to open or close the fast switching valves can be 30 milliseconds or less.

The pressure control valve assembly can also be used in processing other than etching. For example, the pressure control valve assembly can be incorporated in a deposition chamber in which films are deposited on semiconductor substrates. For deposition processes wherein it is desired to cycle chamber pressure while varying the gas flows in the chamber, the movable slotted valve plate can be reciprocated between higher conductance and lower conductance positions to effect pressure changes in the chamber.

Having disclosed the exemplary embodiments and the best mode, modifications and variations may be made to the disclosed embodiments while remaining within the subject and spirit of the invention as defined by the following claims.

What is claimed is:

1. A pressure control valve assembly of a plasma processing chamber in which semiconductor substrates are processed, comprising:

a housing having an inlet, an outlet and a conduit extending between the inlet and the outlet, the inlet adapted to be connected to an interior of the plasma processing chamber and the outlet adapted to be connected to a vacuum pump which maintains the plasma processing chamber at desired pressure set points during processing of a semiconductor substrate in the chamber;

a fixed slotted valve plate having a first set of parallel slots therein and immovably fixed in the conduit such that gasses withdrawn from the chamber into the conduit pass through the first set of parallel slots;

a movable slotted valve plate in the conduit having a second set of parallel slots therein and movable to first and second positions with respect to the fixed slotted valve plate so as to partially block the first set of parallel slots in the first position to a greater extent than in the second position; and a drive mechanism attached to the movable slotted valve plate and operable to rapidly move the movable slotted valve plate between the first and second positions to change pressure in the chamber from a higher pressure to a lower pressure or from a lower pressure to a higher pressure;

wherein the fixed and movable slotted valve plates are circular, the first and second sets of slots having uniform widths W and varying lengths, and wherein the first and second slots provide an open area of 10 to 20% through the fixed slotted valve plate and the movable valve plate when the movable valve plate is positioned in the first position and the first and second slots provide an open area of 25 to 50% through the fixed slotted valve plate and the movable valve plate when the movable valve plate is positioned in the second position.

2. The pressure control valve assembly of claim 1, wherein the drive mechanism includes a stepper motor which moves the movable slotted valve plate from the first position to the second position within 100 milliseconds.

3. The pressure control valve assembly of claim 1, wherein the slots on one half of the fixed and movable slotted valve plates are a mirror image of the slots on the other half thereof.

4. The pressure control valve assembly of claim 1, wherein the first and second sets of slots provide an open area of 30 to 50% through each of the fixed and movable slotted valve plates.

5. The pressure control valve assembly of claim 1, wherein the fixed and movable slotted valve plates have a radius R, and the uniform widths of the first and second sets of slots are about 0.1 R.

6. The pressure control valve assembly of claim 1, wherein the slots of the fixed and movable slotted valve plates are spaced apart by a distance D which is equal to or greater than the uniform width W thereof.

7. The pressure control valve assembly of claim 1, wherein the fixed slotted valve plate is closer to the inlet than the movable slotted valve plate.

8. The pressure control valve assembly of claim 2, wherein the stepper motor is a 500 count per second or faster stepper motor operable to move the movable slotted valve plate from the first position to the second position within 70 milliseconds.

9. The pressure control valve assembly of claim 1, wherein the fixed slotted valve plate includes 6 parallel slots providing an open area of 30 to 40%, and the movable slotted valve plate includes 5 parallel slots providing an open area of 30 to 40%, the first and second sets of slots being identical in width.

10. A method of processing a semiconductor substrate in a chamber having the pressure control valve assembly of claim 1 attached to an outlet of the chamber, comprising steps: (a) adjusting chamber pressure from a lower pressure to a higher pressure by positioning the movable slotted valve plate in the first position while supplying a processing gas to the chamber and (b) adjusting chamber pressure from a higher pressure to a lower pressure by positioning the movable slotted valve plate in the second position while supplying the same or different process gas to the chamber.

11. The method of claim 10, wherein the processing comprises plasma etching openings in silicon using alternating steps of etching while supplying an etching gas to the chamber and deposition while supplying a deposition gas to the chamber, the etching gas comprising a fluorine containing gas supplied for less than 1.3 seconds and energized into a plasma state while maintaining the first pressure above 150 mTorr and the deposition gas comprising a fluorocarbon containing gas supplied for less than 0.7 second and energized into a plasma state while maintaining the second pressure below 130 mTorr.

12. The method of claim 11, further comprising a polymer clearing step before the etching step, the polymer clearing step being carried out by supplying a polymer clearing gas for at least 200 milliseconds and energizing the polymer clearing gas into a plasma state while maintaining the chamber pressure below 150 mTorr.

13. The method of claim 10, wherein the processing comprises depositing a film on the substrate.

14. The method of claim 10, wherein rapid alternating of steps (a) and (b) is carried out for at least 100 cycles.

15. The method of claim 10, wherein the movable slotted valve plate is moved from the first position to the second position within 300 milliseconds.

16. The method of claim 10, wherein the chamber is an inductively coupled plasma chamber having a chamber volume of at least 60 liters and the processing comprises energizing etching gas into a plasma state and plasma etching the semiconductor substrate.

17. The method of claim 10, wherein the processing comprises a deposition process wherein chamber pressure is repeatedly varied while supplying the same or different process gas while the chamber is cycled between various set points.

18. The method of claim 10, further comprising positioning the movable valve plate to the first position to provide an open area of 10 to 20% through the respective first and second slots of the fixed slotted valve plate and the movable valve plate and positioning the movable valve plate to the second position to provide an open area of 25 to 50% through the respective first and second valve slots of the fixed slotted valve plate and movable valve plate.

* * * * *